United States Patent
Lee et al.

(10) Patent No.: US 9,666,485 B2
(45) Date of Patent: May 30, 2017

(54) METHOD FOR FORMING SEMICONDUCTOR DEVICE HAVING SUPER-JUNCTION STRUCTURES

(71) Applicant: Vanguard International Semiconductor Corporation, Hsinchu (TW)

(72) Inventors: Tsung-Hsiung Lee, Taoyuan (TW); Jui-Chun Chang, Hsinchu (TW); Hsiung-Shih Chang, Taichung (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 15/189,844

(22) Filed: Jun. 22, 2016

(65) Prior Publication Data

US 2016/0300930 A1 Oct. 13, 2016

Related U.S. Application Data

(62) Division of application No. 14/248,979, filed on Apr. 9, 2014, now Pat. No. 9,406,742.

(51) Int. Cl.
*H01L 21/336* (2006.01)
*H01L 21/8234* (2006.01)
(Continued)

(52) U.S. Cl.
CPC .. *H01L 21/823487* (2013.01); *H01L 21/2253* (2013.01); *H01L 21/76224* (2013.01); *H01L 29/0615* (2013.01); *H01L 29/0634* (2013.01); *H01L 29/4236* (2013.01); *H01L 29/66681* (2013.01); *H01L 29/66734* (2013.01); *H01L 29/7816* (2013.01); *H01L 29/7824* (2013.01); (Continued)

(58) Field of Classification Search
CPC ........... H01L 29/66734; H01L 29/0634; H01L 29/4236; H01L 21/2253; H01L 21/76224; H01L 29/7816; H01L 21/26506; H01L 21/823412; H01L 21/823493
USPC ....... 438/197, 420, 514, 218, 219, 296, 524, 438/542
See application file for complete search history.

(56) References Cited

U.S. PATENT DOCUMENTS 6,410,958 B1 6/2002 Usui et al.
6,787,872 B2 9/2004 Kinzer et al.
(Continued)

FOREIGN PATENT DOCUMENTS

TW 201248853 A1 12/2012

*Primary Examiner* — Shouxiang Hu
(74) *Attorney, Agent, or Firm* — Birch, Stewart, Kolasch & Birch, LLP

(57) ABSTRACT

A semiconductor device is disclosed. The device includes an epitaxial layer on a substrate, wherein the epitaxial layer includes first trenches and second trenches alternately arranged along a first direction. The epitaxial layer between the adjacent first and second trenches includes a first doping region and a second doping region, and the first doping region and the second doping region have different conductivity types. An interface is between the first doping region and the second doping region to form a super-junction structure. A gate structure is on the epitaxial layer. The epitaxial layer under the gate structure includes a channel extending along a second direction, and the first direction is perpendicular to the second direction.

8 Claims, 13 Drawing Sheets

(51) Int. Cl.

| | |
|---|---|
| *H01L 29/06* | (2006.01) |
| *H01L 29/66* | (2006.01) |
| *H01L 21/762* | (2006.01) |
| *H01L 29/78* | (2006.01) |
| *H01L 29/423* | (2006.01) |
| *H01L 21/225* | (2006.01) |
| *H01L 29/786* | (2006.01) |
| *H01L 21/265* | (2006.01) |

(52) U.S. Cl.
CPC .. *H01L 29/78624* (2013.01); *H01L 21/26586* (2013.01)

(56) References Cited

U.S. PATENT DOCUMENTS

| | | |
|---|---|---|
| 7,105,387 B2 | 9/2006 | Minato et al. |
| 7,381,603 B2 | 6/2008 | Hossain et al. |
| 8,105,924 B2 * | 1/2012 | Orner ............... H01L 21/763 257/216 |
| 8,580,651 B2 | 11/2013 | Ishiguro |
| 8,642,427 B1 * | 2/2014 | Sihombing ....... H01L 29/66712 257/329 |
| 2013/0149822 A1 * | 6/2013 | Lee ................ H01L 21/82348 438/212 |

* cited by examiner

METHOD FOR FORMING SEMICONDUCTOR DEVICE HAVING SUPER-JUNCTION STRUCTURES

CROSS-REFERENCE TO RELATED APPLICATIONS

This application is a Divisional of copending application Ser. No. 14/248,979, filed on Apr. 9, 2014, all of which are hereby expressly incorporated by reference into the present application.

BACKGROUND OF THE INVENTION

Field of the Invention

This invention generally relates to semiconductor technology, and more particularly to a semiconductor device having super-junction structures and fabrication thereof.

Description of the Related Art

Most conventional vertical diffused metal-oxide semiconductor field-effect transistors (VDSNOFETs) use an n-type epitaxial drift region and a p-typed based doping region thereon to form a p-n junction for withstanding the applied voltage. When increasing the operating voltage of the semiconductor device, the doping concentration of the n-type epitaxial drift region must be decreased, and hence thickness thereof must be increased. Since on-resistance ($R_{on}$) is limited by the doping concentration and thickness of the n-type epitaxial drift region, this way of increasing the withstand voltage of a p-n junction increases on-resistance. A diffused metal-oxide semiconductor field-effect transistor with a super-junction structure is capable of improving $R_{on}$ and withstanding high break-down voltages.

The column-shaped n-type doping region and the p-typed doping region formed by ion-implantation are employed to achieve charge balance, such that the device is capable of withstanding high voltage. However, the method using the column-shaped n-type doping region and the p-typed doping region is limited by the maximum depth of ion implantation after performing thermal diffusion. Therefore, the area for current to pass through is also limited. The size of the device must be increased in order to increase the total surface area of the n-type doping region and the p-typed doping region.

Accordingly, a semiconductor device with a super-junction structure and fabrication thereof is required to address the issues of the conventional technology.

BRIEF SUMMARY OF INVENTION

An aspect of the disclosure provides a semiconductor device comprising the following elements. An epitaxial layer is on a substrate, wherein the epitaxial layer comprises first trenches and second trenches alternately arranged along a first direction. The epitaxial layer between the adjacent first and second trenches comprises a first doping region and a second doping region, and the first doping region and the second doping region have different conductivity types. An interface between the first doping region and the second doping region forms a super-junction structure. A gate structure is on the epitaxial layer, wherein the epitaxial layer under the gate structure comprises a channel extending along a second direction, and the first direction is perpendicular to the second direction.

Another aspect of the disclosure provides a method for forming a semiconductor device comprising providing a substrate. An epitaxial layer is formed on the substrate. First trenches and second trenches are formed in the epitaxial layer and alternately arranged along a first direction. A first doping region and a second doping region are formed in the epitaxial layer between the adjacent first and second trenches, wherein the first doping region and the second doping region have different conductivity types, and a super-junction structure is formed at the interface between the first doping region and the second doping region. A gate structure is formed over the epitaxial layer, wherein the epitaxial layer under the gate structure comprises a channel extending along a second direction, and wherein the first direction is perpendicular to the second direction.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatuses. The following discussion is only used to illustrate the invention, not limit the invention.

Figure 3:
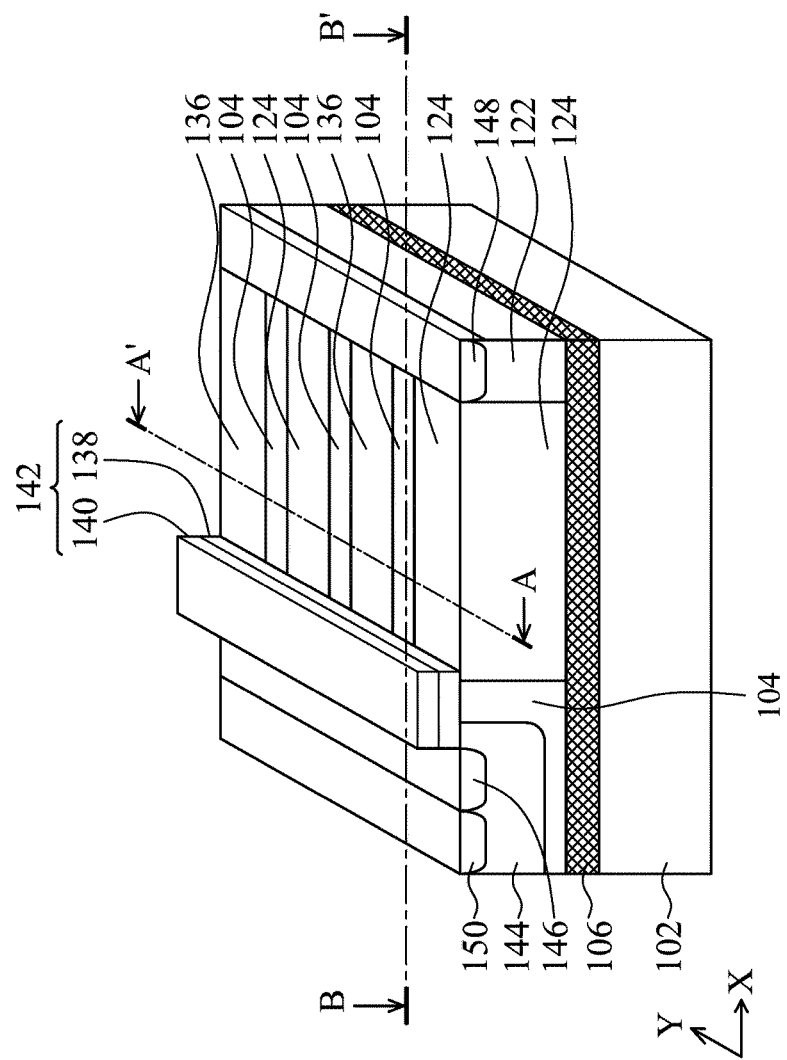
FIG. 3 is a perspective diagram of a semiconductor device with super-junction structures of an embodiment of the disclosure.

FIG. 3 is a perspective diagram of a semiconductor device with super-junction structures of an embodiment of the disclosure. FIGS. 1A to 1F are cross sections along line A-A' of FIG. 3 showing intermediate steps of a method for forming a semiconductor device of an embodiment of the disclosure.

Figure 1A:
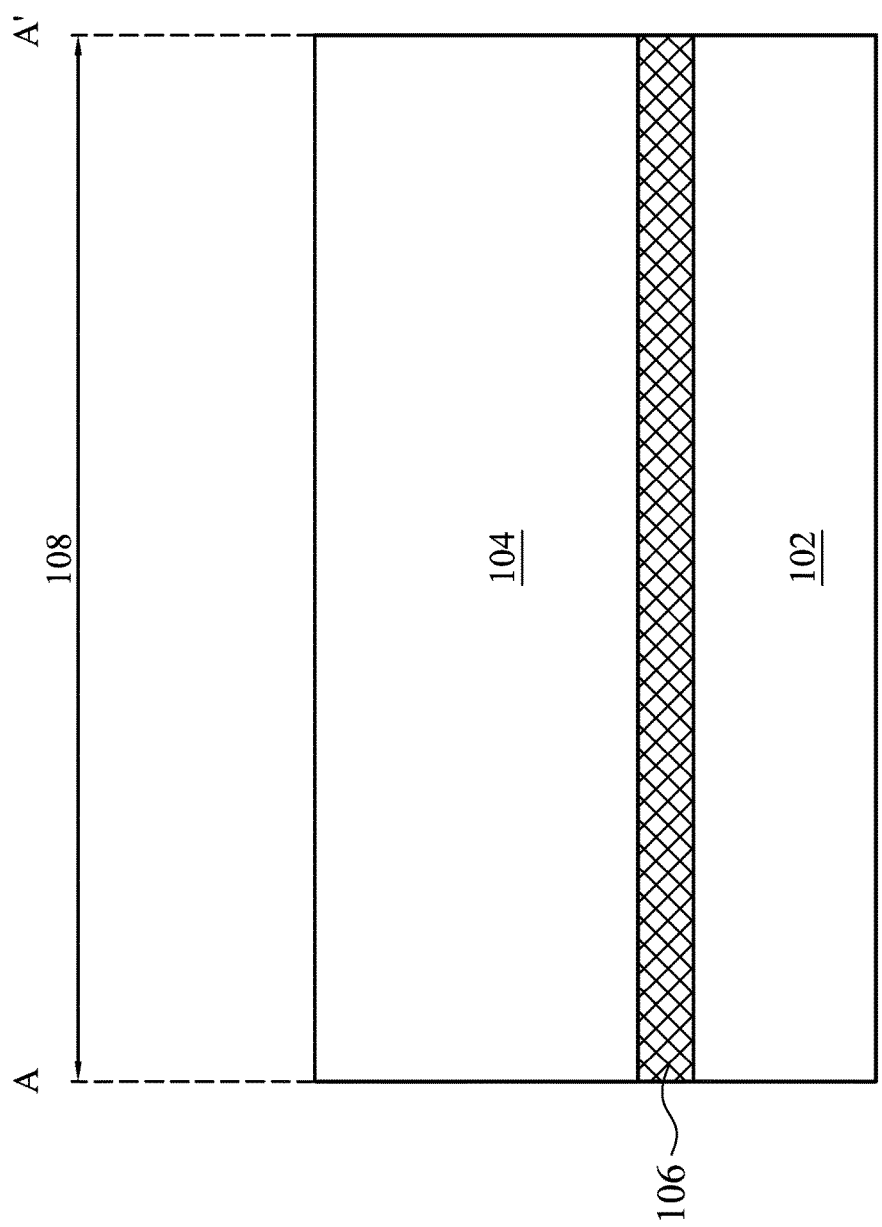
FIGS. 1A to 1F are cross-sections of intermediate stages of a method for forming a semiconductor device of an embodiment of the disclosure.

Referring to FIG. 1A, a semiconductor substrate 102 having a conductivity type is provided. Next, an insulating layer 106 is formed on the semiconductor substrate 102. In some embodiments, the insulating layer 106 comprises silicon oxide, silicon nitride, silicon oxynitride or other suitable insulating materials.

Thereafter, an epitaxial growth process is performed to form an epitaxial layer 104 on the insulating layer 106. In some embodiments, the semiconductor substrate 102 and the epitaxial layer 104 have the same conductivity type. In an example, the semiconductor substrate 102 is an n-type heavily doped ($N^+$) semiconductor substrate 102, and the epitaxial layer 104 is an n-typed lightly doped ($N^-$) epitaxial layer 104. The epitaxial layer 104 may include an active region 108.

Figure 1B:
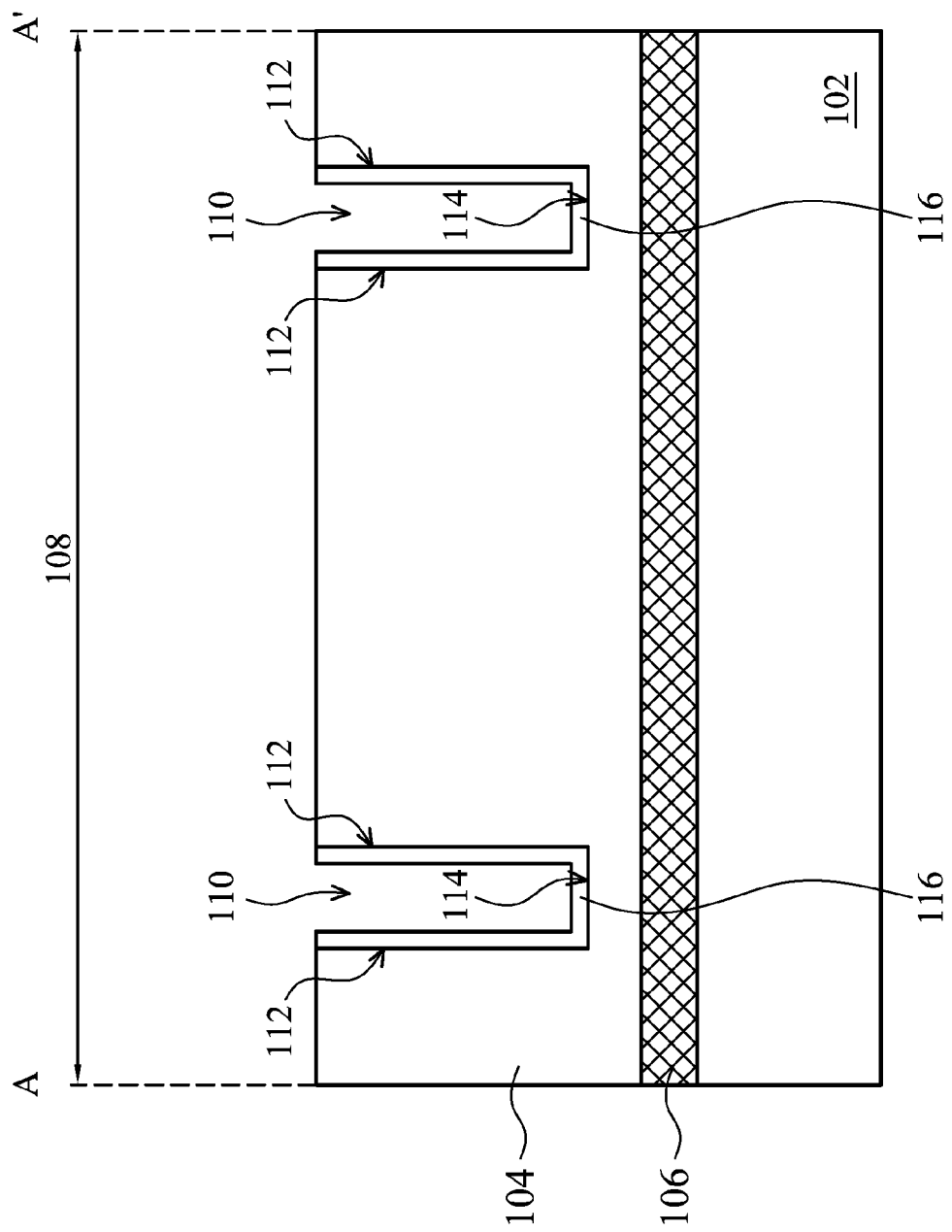

Next, referring to FIG. 1B, a method for forming first trenches 110 is illustrated. For example, low pressure chemical vapor deposition is performed to form a hard mask (not shown). A patterning process is performed to form a mask pattern (not shown) on the active region 108 of the epitaxial layer 104 to define locations of the first trenches 110. An anisotropic etching process is performed to remove a portion of the epitaxial layer 104 not covered by the mask pattern for forming first trenches 110 in the active region 108 along a first direction (e.g., the direction Y shown in FIG. 3). In an embodiment, the bottom surfaces 114 of the first trenches 110 may directly contact the insulating layer 106, or be within the epitaxial layer 104 (i.e., depths of the first trenches 110 is less or equal to thickness of the epitaxial layer 104). The invention does not limit depth of the first trench 110. Depth of the first trenches 110 may be varied with respect to specification of products or related processes.

After removing the mask pattern, a thermal oxidation process is performed to conformably form a first insulating liner layer 116 on the sidewalls 112 and the bottom surface 114 of the each first trench 110. In some embodiments, the first insulating liner layer 116 is an oxide liner layer which can reduce stress on the epitaxial layer 104.

Figure 1C:
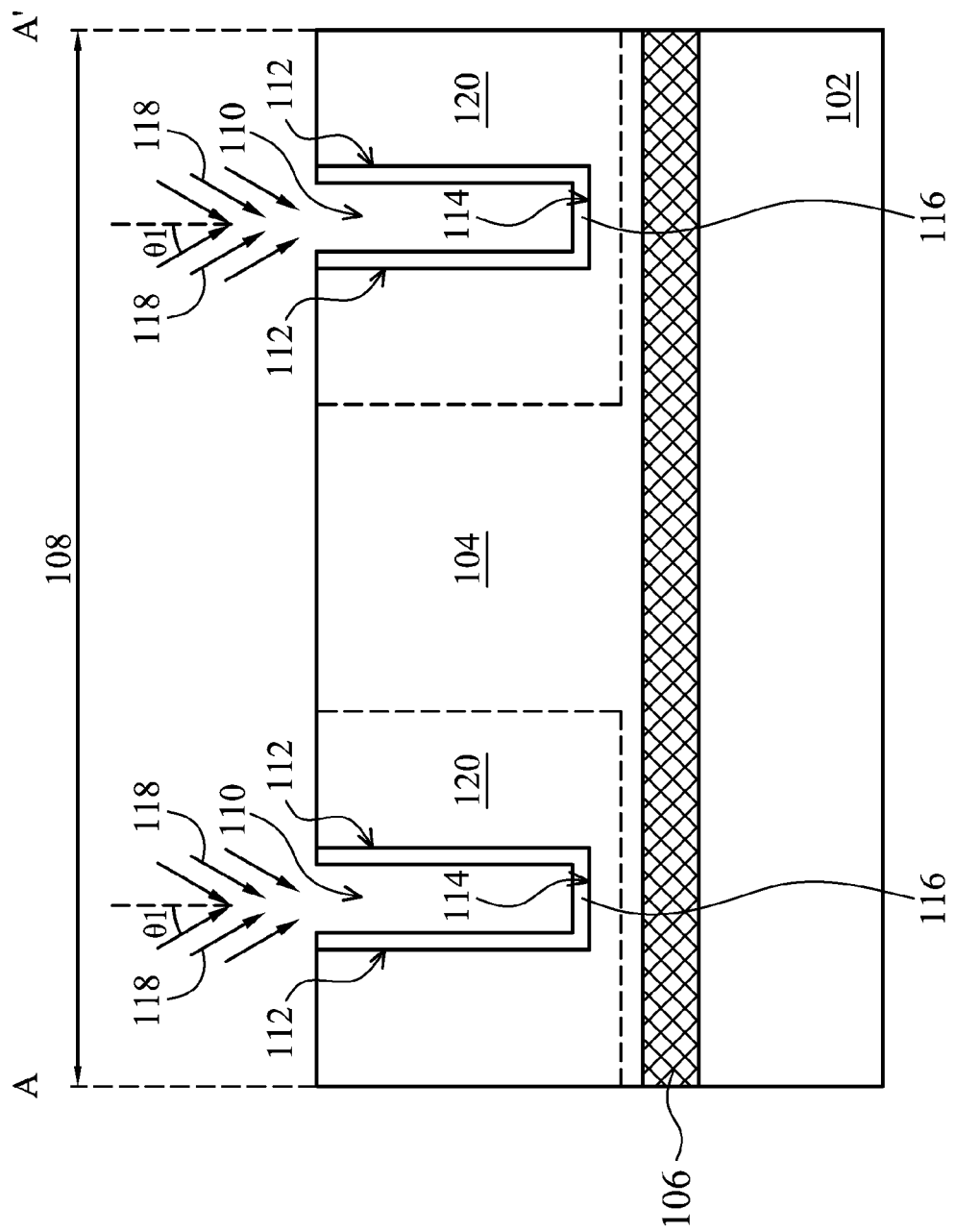

Next, referring to FIG. 1C, a tilt-angle doping process 118 (e.g., ion implantation) is performed to dope the epitaxial layer 104 through opposite sidewalls 112 of the first trenches 110 with first dopants having a first conductivity type, thereby forming first doping regions 120. In some embodiments, the doping process 118 has a doping angle $\theta 1$ that is determined by the width and depth of the first trench 110. For example, the doping angle $\theta 1$ is in an range between 0° and 10°. In addition, in some embodiments, the first dopants are n-type dopants which comprise phosphorous or arsenic.

In some embodiments, after performing the doping process 118, another doping process can be performed to dope the epitaxial layer 104 with first dopants 110 having a first conductivity type through sidewalls of the first trenches 110, thereby forming a third doping region 122 (referring to FIG. 3). Therefore, good ohmic contact for the drain in subsequent steps can be provided. In some embodiments, the first dopants of the doping step may comprise phosphorous or arsenic.

In some embodiments, after performing the doping processes, a thermal diffusion process is performed at a temperature in a range of about 800° C. to 1500° C. to make distribution of the first dopants in the first doping region 120 and the third doping region 122 more uniform. After performing the thermal diffusion process, the conductivity type of the first doping region 120 is n-type.

Referring to FIG. 1C, the first doping regions 120 are substantially formed near the opposite sidewalls and the bottom surfaces of the first trenches 110, and the depths of the first doping regions 120 are greater than these of the first trenches 110. Therefore, the bottom surfaces 114 of the first trenches 110 are within the first doping regions 120.

Figure 1D:
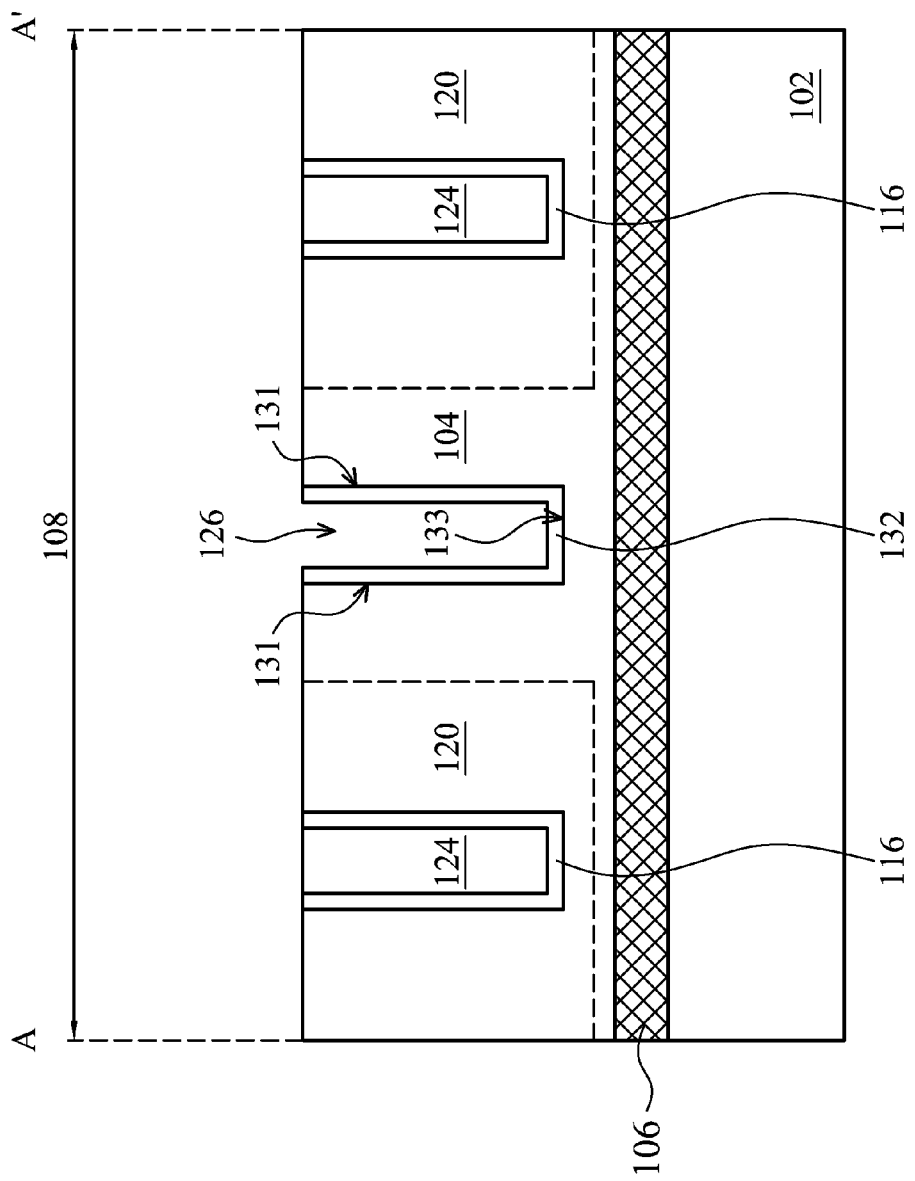

Next, referring to FIG. 1D, a deposition process, such as low pressure chemical vapor deposition, or a coating process, such as spin on glass, is performed to form a first insulating material 124 on the top surface of the epitaxial layer 104 and filling the first trenches 110 to cover the first insulating liner layer 116. Thereafter, a planarization process such as a chemical mechanical polishing process, is performed to remove excess first insulating material 124 on the top surface of the epitaxial layer 104. In some embodiments, the first insulating material 124 comprises oxide or undoped polysilicon. After the planarization process, the top surface of the first insulating material 124 is substantially coplanar with the top surface of the epitaxial layer 104.

In some embodiments, the first insulating liner layer 116 can be omitted, such that the first insulating material 124 in the first trench 110 directly contacts the sidewalls 112 and the bottom surface 114 of the first trench 110. For example, the first insulating material 124 can be silicon oxide and is directly filled into the first trench 110 and directly contacts the sidewalls 112 and the bottom surfaces 114 of the first trenches 110.

Referring to FIG. 1D, a method for forming second trenches 126 is illustrated. For simplicity, only one second trench 126 is shown in FIG. 1D. However, in another embodiment, according to the design of the device, the number of second trenches 126 can be equal to or greater than two. Low-pressure chemical vapor deposition, for example, is performed to form a hard mask (not shown). A patterning process is then performed to form a mask pattern (not shown) on the active region 108 of the epitaxial layer 104 to define locations of the second trenches 126. In the embodiment, the first trenches 110 and the second trenches 126 are alternately arranged along a first direction (e.g., the Y direction shown in FIG. 3). Namely, opposite sides of the second trench 126 neighbor the first trenches 110. Thereafter, an anisotropic etching process is performed to remove a portion of epitaxial layer 104 not covered by the mask pattern, thereby forming second trenches 126 in the active region 108 of the epitaxial layer 104.

In some embodiments, the bottom surfaces of the second trenches 126 may come into direct contact with the insulating layer 106, or be within the second trenches 126. In some embodiments, the first trenches 110 and the second trenches 126 have the same width and depth. The width and depth can be adjusted according to the device properties. In some embodiments, depths of the first trenches 110 and the second trenches 126 are in a range of about 1 μm-60 μm.

After removing the mask pattern, a thermal growth process is performed to conformably form a second insulating liner layer 132 on the sidewalls and bottom surface of each second trench 126. In the embodiment, the second insulating liner layer 132 can be an oxide liner layer which can reduce stress on the epitaxial layer 104.

Figure 1E:
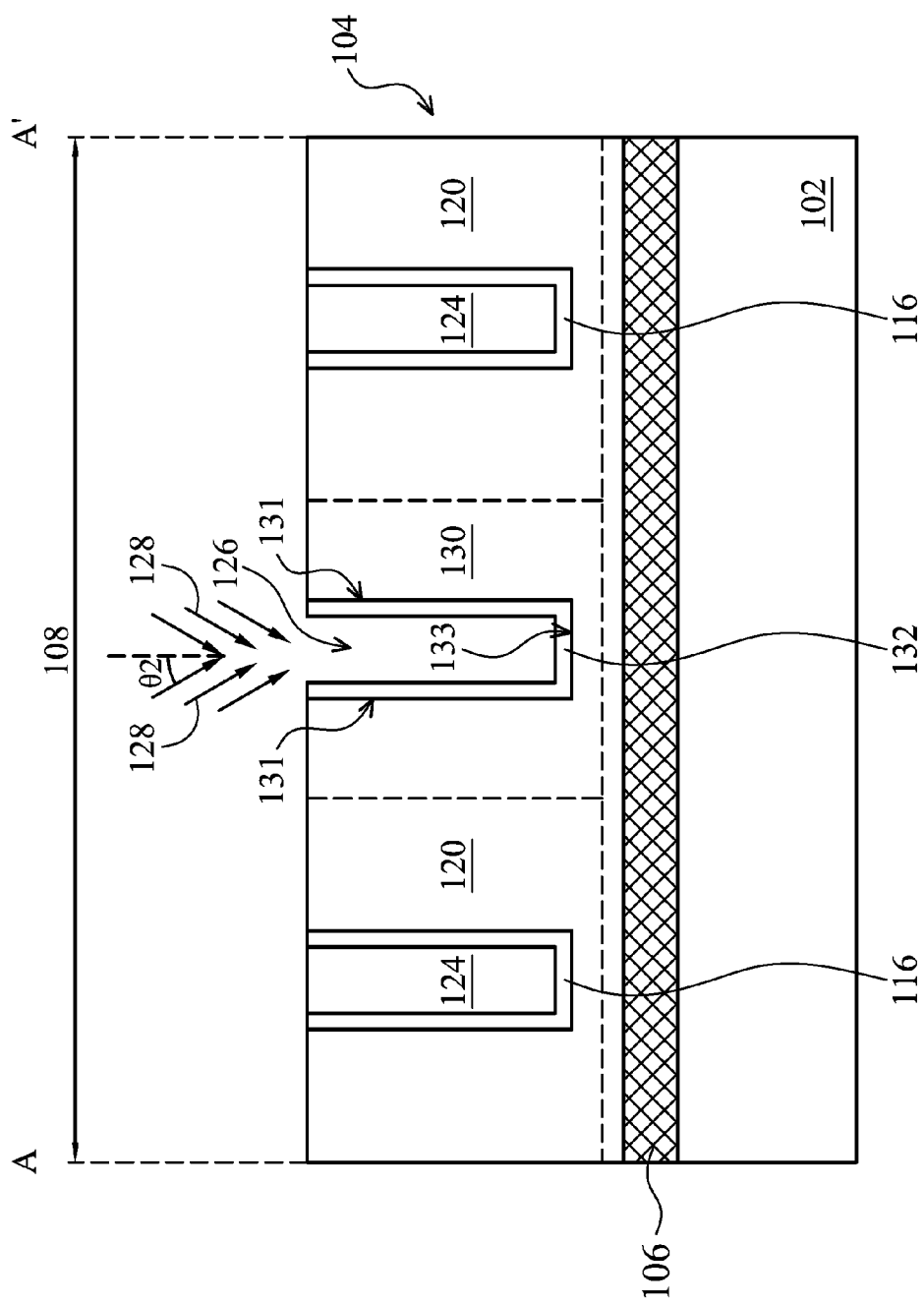

Next, referring to FIG. 1E, a doping process 128 is performed to dope the epitaxial layer 104 with second dopants having a second conductivity type through the opposite sidewalls 131 of the second trenches 126, thereby forming second doping regions 130 neighboring the sidewalls of the second trenches 126 and the first doping regions 120 in the active region 108. In some embodiments, the second doping process 128 has a doping angle $\theta 2$ that is determined by the width and depth of the second trench 126. For example, the doping angle $\theta 2$ is in a range between 0° and 10°. In addition, in some embodiments, the second dopants are p-type dopants which comprise boron. In this embodiment, after performing the doping process 128, a thermal diffusion process is performed at a temperature in a range of about 800° C. to 1500° C. to make distribution of the second dopants in the second doping region 130 more uniform. After performing the thermal diffusion process, the conductivity type of the second doping region 130 is p-type.

As shown in FIG. 1E, the second doping regions 130 are substantially formed near the opposite sidewalls and the bottom surfaces of the second trenches 126, and depth of the second doping regions 130 is greater than that of the second trenches 126. Therefore, the bottom surfaces of the second trenches 126 are within the second doping regions 130.

In some embodiments, after performing the doping process 128, another doping process can be performed to dope the epitaxial layer 104 with first dopants having first conductivity type through sidewalls of the second trenches 126, thereby forming a third doping region 122 (referring to FIG. 3). Therefore, good ohmic contact for the drain region in subsequent steps can be provided. In some embodiments, the first dopants may comprise n-type dopants such as phosphorous or arsenic.

Figure 1F:
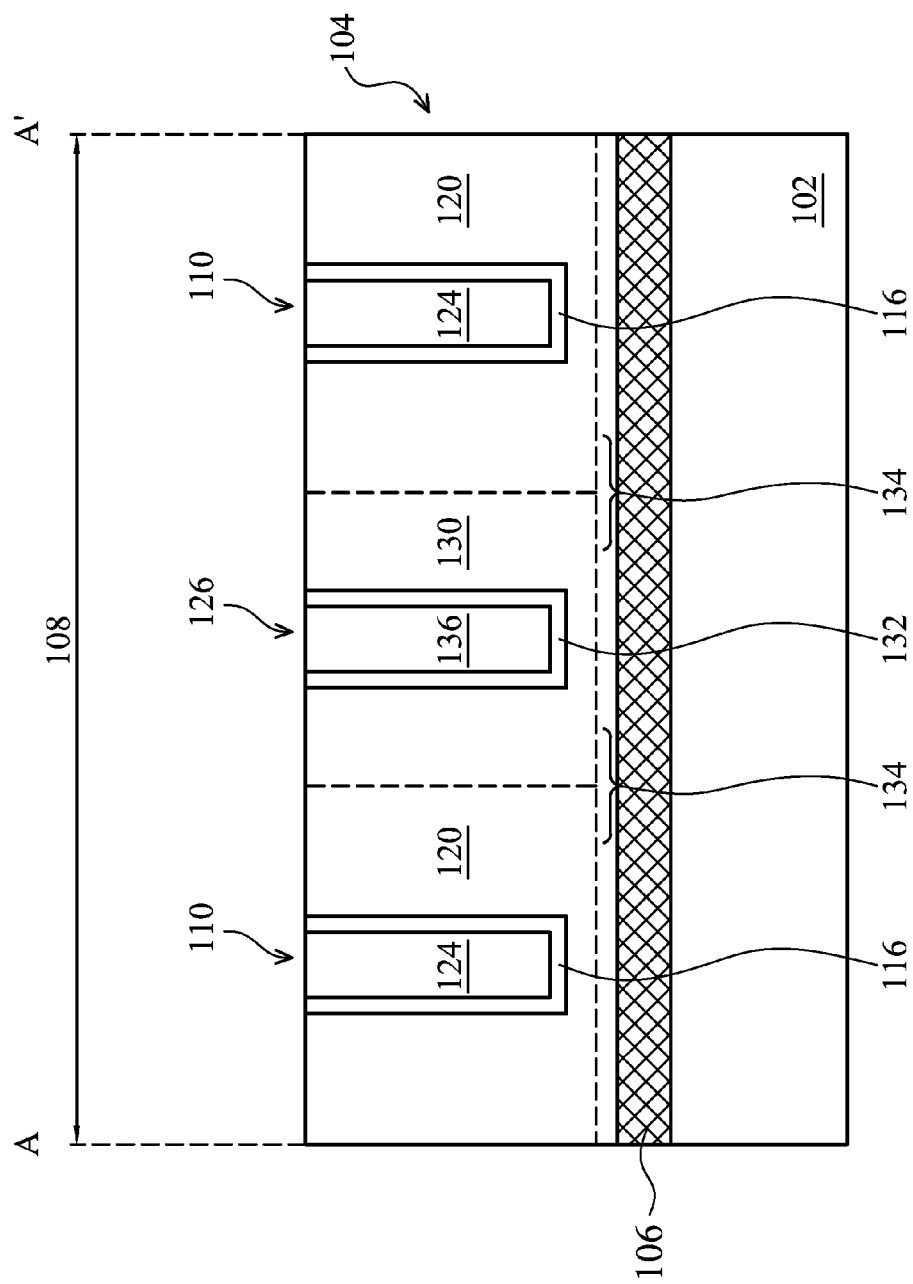

Next, referring to FIG. 1F, a deposition process, such as low pressure chemical vapor deposition, or a coating process, such as spin on glass, is performed to form a second insulating material 136 on the top surface of the epitaxial layer 104 and filling the second trenches 126 to cover the second insulating liner layer 132. Thereafter, a planarization process such as chemical mechanical polishing process is performed to remove the excess second insulating material 136 on the top surface of the epitaxial layer 104. In some embodiments, the second insulating material 136 comprises oxide or undoped polysilicon. After performing the planarization process, the top surface of the second insulating material 136 is substantially coplanar with the top surface of the epitaxial layer 104. After completing the processes described, each of the first doping regions 120 has a conductivity type opposite to that of each of the second doping regions 130 have reverse and the first doping region 120 and the second doping region 130 neighbor with each other to form an interface therebetween. Therefore, super-junction structures 134 of the disclosure are formed. In another embodiment, the conductivity types of the first doping region 120 and the second doping region 130 of the super-junction structure 134 can be changed from each other.

Figure 2A:
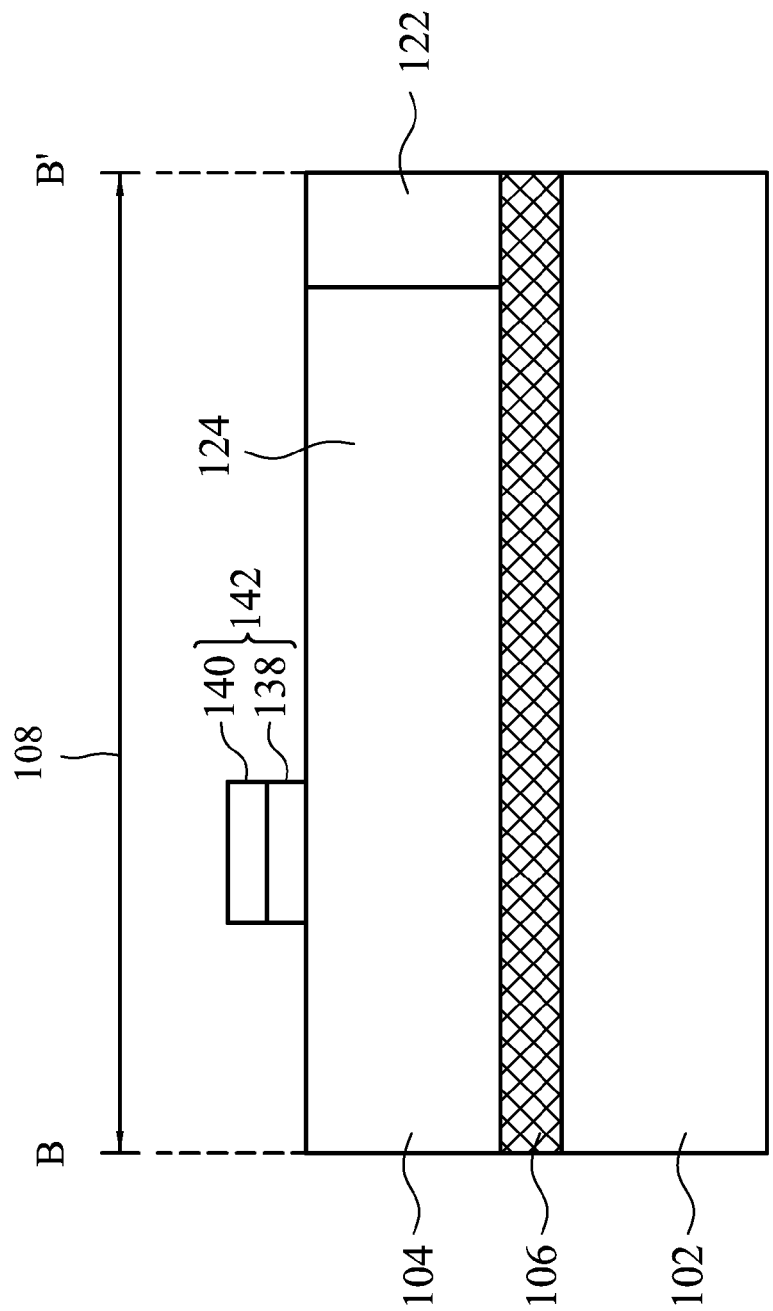
FIGS. 2A to 2B are cross-sections of intermediate stages of a method for forming a semiconductor device of an embodiment of the disclosure.
Figure 2B:
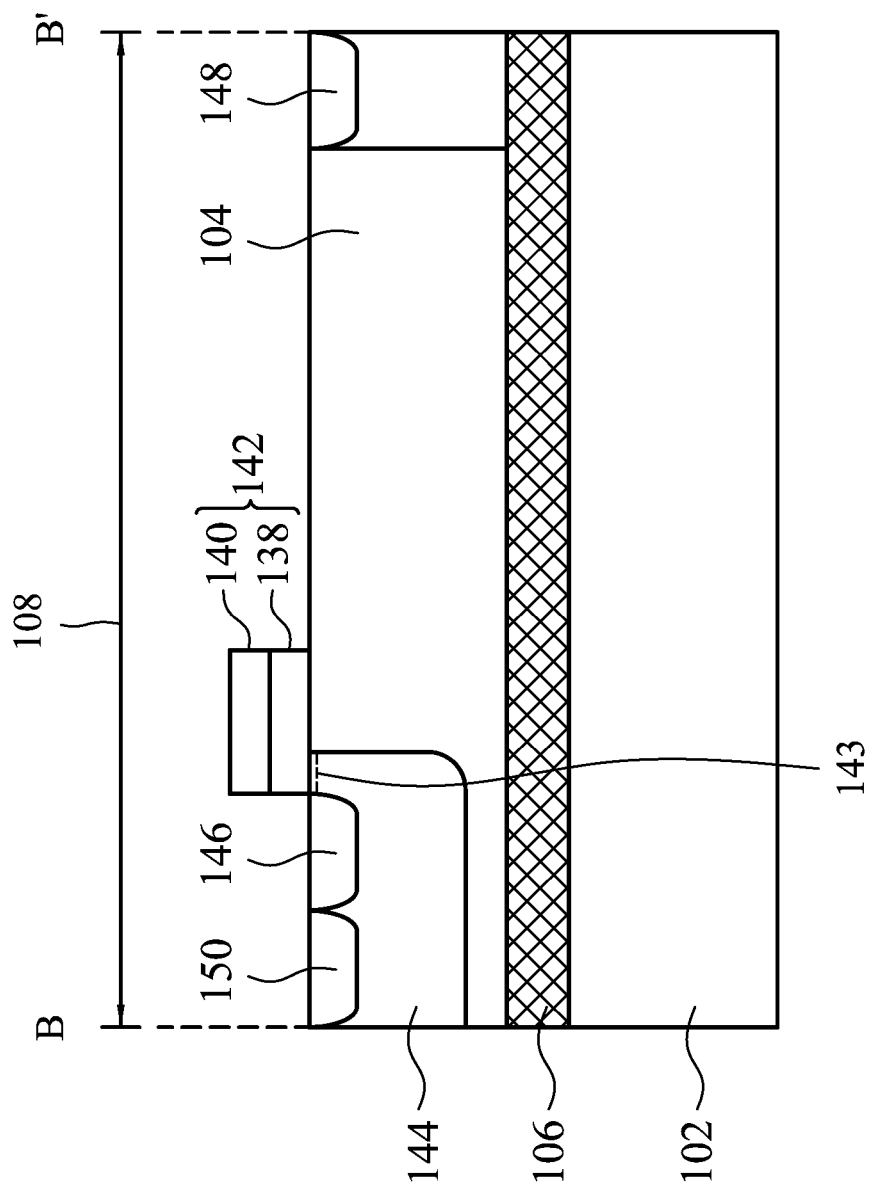

FIGS. 2A and 2B are cross-sections along line B-B' of FIG. 3 showing intermediate steps of a method for forming a semiconductor device of an embodiment of the disclosure. The steps after FIG. 1F are illustrated in accordance with FIGS. 2A and 2B.

Referring to FIG. 2A, a gate dielectric layer (not shown) and a gate layer (not shown) is blankety and successively formed on the epitaxial layer 104. In some embodiments, the gate dielectric layer is formed by thermal oxidation, chemical vapor deposition (CVD), or atomic layer deposition (ALD). The gate layer is formed by chemical vapor deposition, physical vapor deposition, atomic layer deposition, sputtering or electroplating. In some embodiments, the gate dielectric layer comprises oxide, nitride, oxynitride, oxycabride or a combination thereof. In some embodiments, the gate layer comprises a polysilicon layer or a metal layer.

Next, a patterned photoresist layer (not shown) is formed on the active region 108 of the epitaxial layer 104 to define a location of the gate dielectric pattern 138 and the gate pattern 140 shown in FIG. 2A. An anisotropic etching process is performed using the patterned photoresist layer as a mask to remove a portion of the gate dielectric layer and the gate layer for forming a gate structure 142 comprising a gate dielectric pattern layer 138 and a gate pattern layer 140 on the active region 108. In some embodiments, as shown in FIG. 3, the gate structure 142 may align an edge of one end of each first trench 110 and that of each second trench 126 or partially cover one end of each first trench 110, that of each second trench 126, and the epitaxial layer 104 between the first trenches 110 and the second trenches 126. Namely, the gate structure 142 is formed on the epitaxial layer 104 between the first trenches 110 and the second trenches 126 and extends along the first direction (e.g., the direction Y shown in FIG. 3) and epitaxial layer.

Thereafter, referring to FIG. 2B, a doping process can be performed to form a well region 144 having the second conductivity type in the active region 108 of the epitaxial layer 104. As shown in FIG. 2B, the well region 144 extends to be under a portion of the gate structure 142. In some embodiments, the well region 144 is a p-type well region. The bottom of the well region 144 may directly contact the insulating layer 106, or be above the insulating layer 106.

Next, a source/drain doping process is performed to dope the well region 144 and the third doping region 122 with first dopants having first conductivity type, thereby forming a source region 146 in the well region 144 and a drain region 148 in the third doping region 122. As a result, a channel 143 under the gate structure 142 extends along a second direction (e.g., the direction X shown in FIG. 3). In some embodiments, the conductivity type of the source region 146 in the well region 144 is n-type, and the doping concentration of the source region 146 is greater than that of the well region 144. In some embodiments, the channel 143 is within the well region 144.

Next, referring to FIG. 2B, a doping process is performed to form a connection region 150 have the second conductivity type in the well region 144. In some embodiments, the conductivity type of the connection region 150 is p-type. As shown in FIG. 2B, the connection region 150 neighbors the source region 146, and is within the well region 144.

The embodiment described above uses an n-type MOSFET as an example to illustrate a method of forming a semiconductor device. In other embodiments, the first conductivity type and the second conductivity type can be exchanged to form a p-type MOSFET.

According to the embodiments mentioned above, a super-junction structure is formed by forming trenches and performing ion implantation therein. As a result, the depth of the super-junction structure can correspond to that of the trenches, so that the depth of the super-junction structure of the embodiments is deeper than that of the super-junction structure formed by conventional technology, thereby increasing the area for passing the driving current. Therefore, driving current can be improved, and on-resistance can be decreased.

FIGS. 4A-4D are cross sections along A-A' of FIG. 3 showing intermediate steps of a method for forming a semiconductor device of another embodiment of the disclosure. The difference between the embodiment of FIGS. 4A to 4D and the embodiment of FIGS. 1A to 1F is that the first trenches and the second trenches are filled with a doping material, rather than an insulating material.

Figure 4A:
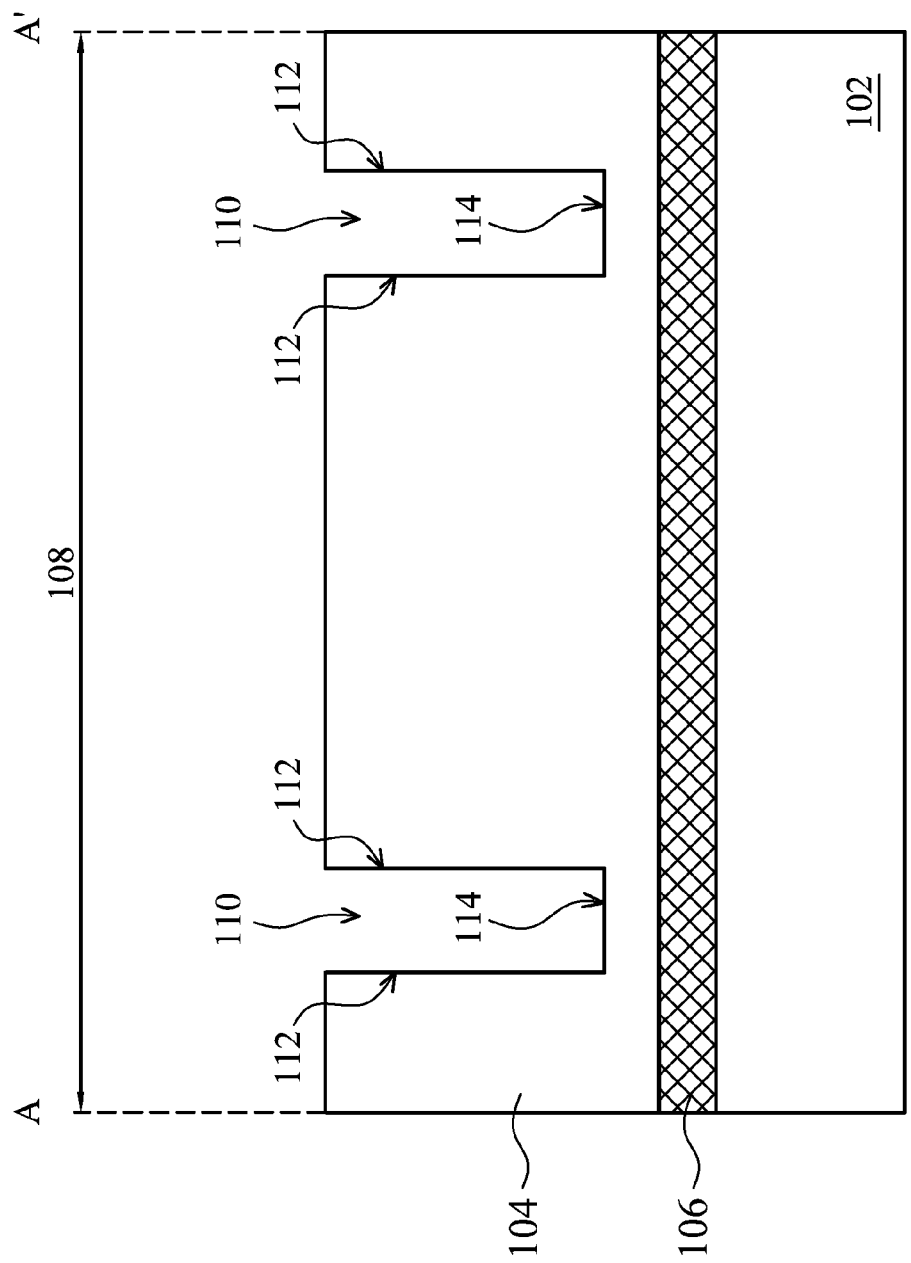
FIGS. 4A to 4D are cross-sections of intermediate stages of a method for forming a semiconductor device of another embodiment of the disclosure.

In FIG. 4A, the structure which is similar to that of FIG. 1A is not described herein.

Referring to FIG. 4A, a method for forming first trenches 110 in the epitaxial layer 104 is illustrated. Low pressure chemical vapor deposition is performed to form a hard mask (not shown). A patterning process is performed to form a mask pattern (not shown) on the active region 108 of the epitaxial layer 104 to define locations of the first trenches 110. An anisotropic etching process is performed to remove a portion of the epitaxial layer 104 not covered by the mask pattern for forming first trenches 110 in the active region 108 of the epitaxial layer 104 and extending along a first direction (e.g., the direction Y shown in FIG. 3).

Figure 4B:
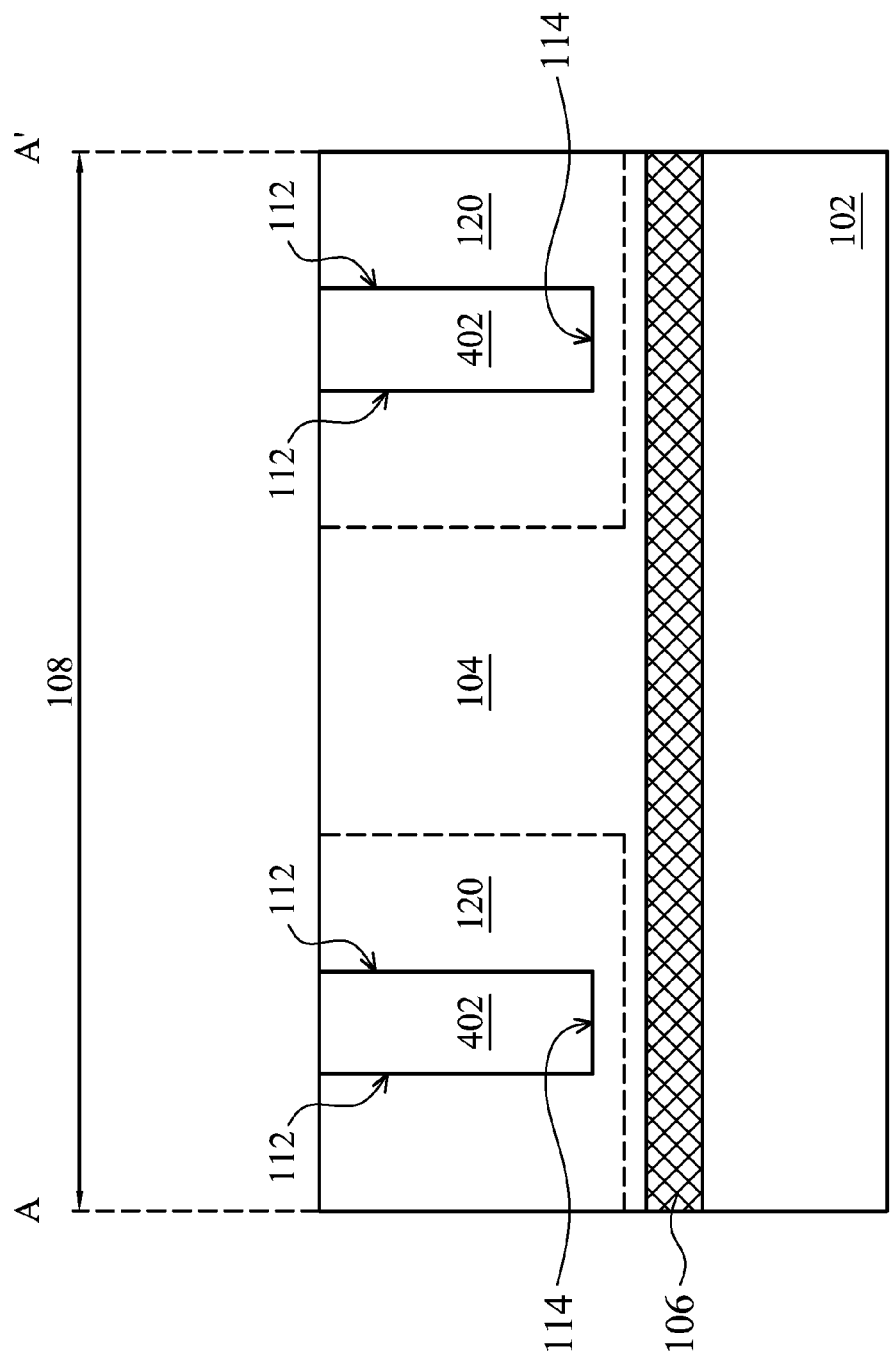

Referring to FIG. 4B, an epitaxy process or a chemical vapor deposition process is performed to form a first doping material 402 on the top surface of the epitaxial layer 104 and filling the first trenches 110. In this embodiment, it is noted that there is no insulating liner layer formed so that the first doping material 402 filled into the first trenches 110 directly contacts sidewalls 112 and bottom surfaces 114 of the first trenches 110. Thereafter, a planarization process, such as chemical mechanical polishing process, is performed to remove the excess first doping material 402 on the top surface of the epitaxial layer 104. In some embodiments, the first doping material 402 comprises an epitaxial or polysilicon layer doped with first dopants having the first doping conductivity type. For example, the first doping material comprises n-type dopants such as phosphorous or arsenic. After performing the planarization process, the top surface of the first doping material is substantially coplanar with the top surface of the epitaxial layer 104.

Next, a thermal diffusion process is performed at a temperature in a range of about 800° C. to 1500° C. to make the first dopants in the first doping material 402 diffuse into the epitaxial layer 104, thereby forming first doping regions 120. The conductivity type of the first doping regions 120 can be n-type.

Figure 4C:
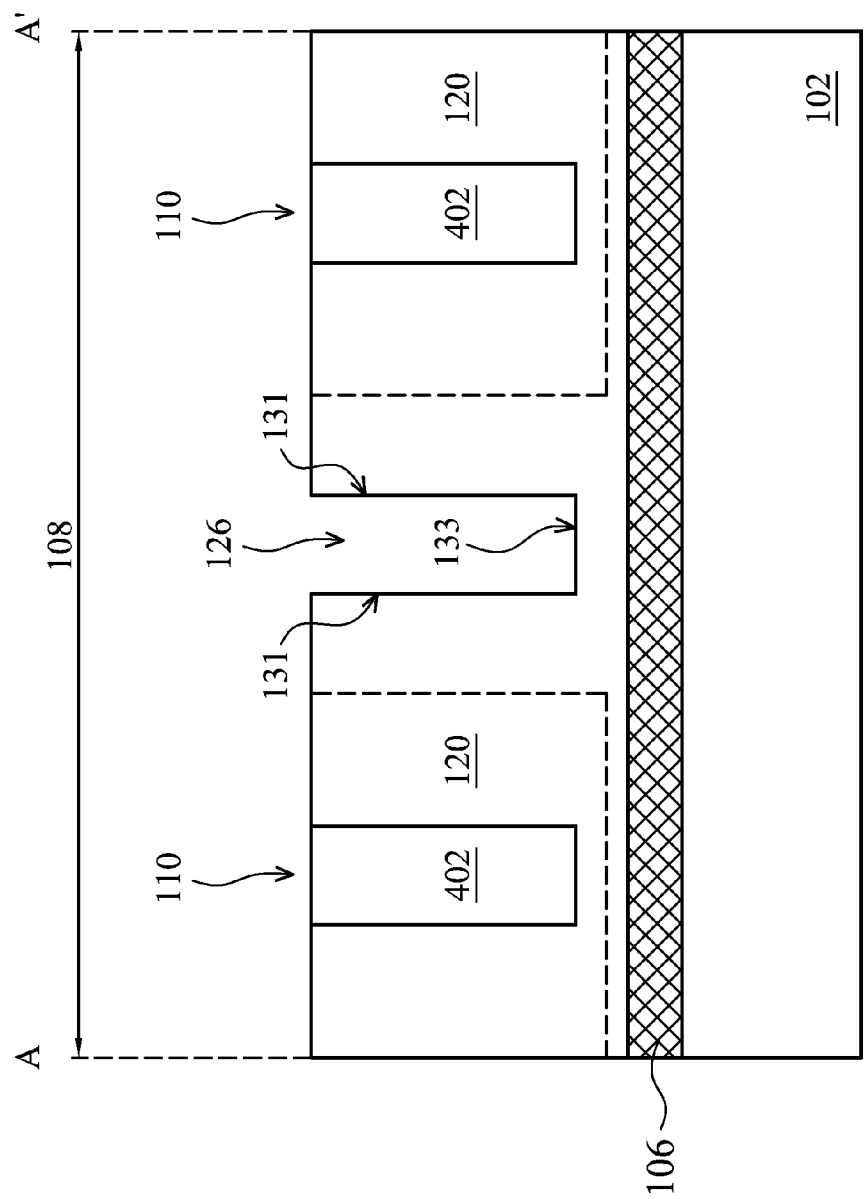

Referring to FIG. 4C, a method for forming second trenches 126 is illustrated. For simplicity, only one second trench 126 is shown in FIG. 4C. However, in another embodiment, according to the design of the device, the number of second trenches 126 can be equal to or greater than two. Low-pressure chemical vapor deposition can be performed to form a hard mask (not shown). A patterning process is then performed to form a mask pattern (not shown) on the active region 108 of the epitaxial layer 104 to define locations of the second trenches 126. In the embodiment, the first trenches 110 and the second trenches 126 are alternately arranged along a first direction (e.g., the Y direction shown in FIG. 3). Namely, opposite sides of the second trench 126 neighbor the first trenches 110. Thereafter, an anisotropic etching process is performed to remove a portion of the epitaxial layer 104 not covered by the mask pattern, thereby forming second trenches 126 in the active region 108 of the epitaxial layer 104.

Figure 4D:
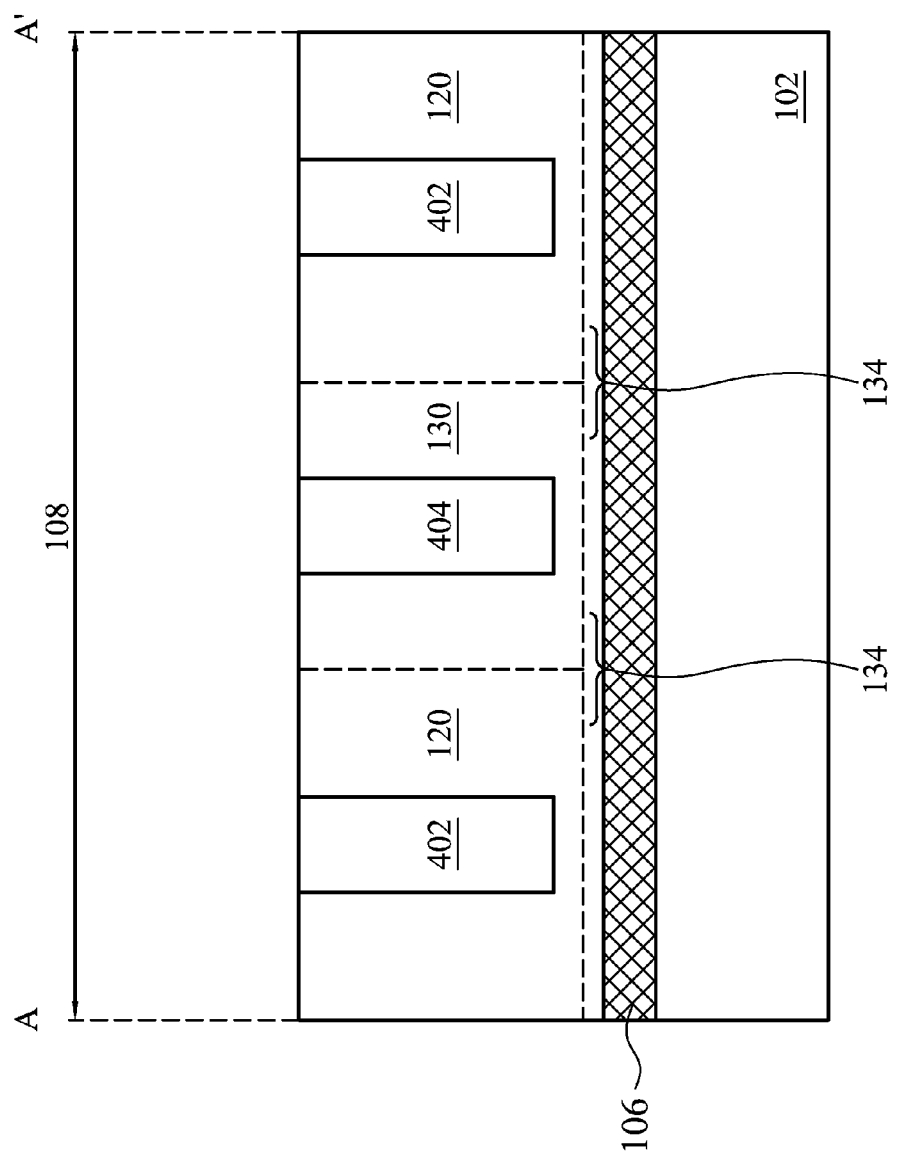

Thereafter, referring to FIG. 4D, an epitaxy process or a chemical vapor deposition process is performed to form a second doping material 404 on the top surface of the epitaxial layer 104, filled into the second trenches 126. In this embodiment, it is noted that there is no insulating liner layer formed so that the second doping material 404 filled into the second trenches 126 directly contacts the sidewalls 131 and bottom surfaces 133 of the second trenches 126. Thereafter, a planarization process such as chemical mechanical polishing process is performed to remove the excess second doping material 404 on the top surface of the epitaxial layer 104. In some embodiments, the second doping material 404 comprises an epitaxial or polysilicon layer doped with second dopants having the second doping conductivity type. For example, the second doping material 404 comprises p-type dopants such as boron. After performing the planarization process, the top surface of the second doping material 404 is substantially coplanar with the top surface of the epitaxial layer 104.

Next, a thermal diffusion process is performed at a temperature in a range of about 800° C. to 1500° C. to make the second dopants in the second doping material 404 diffuse into the epitaxial layer 104, thereby forming second doping regions 130.

After completing the process as described, the first doping regions 120 have a conductivity type opposite to that of the second doping regions 130, and the first doping region 120 and the second doping region 130 are neighboring each other to form an interface therebetween. Therefore, super-junction structures 134 of this embodiment of the disclosure are formed.

The subsequent steps of the method for forming the semiconductor device with super-junction structures 134 of the embodiment are similar to the embodiment of FIGS. 2A to 2B, and are not described herein.

The embodiments described above use a gate-last process, i.e. the gate structure is formed after formation of the super-junction structures. However, the invention is not limited thereto. The gate structure can be formed prior to formation of the super-junction structures.

The semiconductor device with super-junction structures of an embodiment of the disclosure is illustrated in accordance with FIGS. 1F, 2B and 3. Referring to FIGS. 1F (or 4D), 2B and 3, a substrate 102 and an insulating layer 106 thereon are provided. An epitaxial layer 104 is on the insulating layer 106. First trenches 110 and second trenches 126 alternately arranged are disposed in the epitaxial layer 104 and extend along a first direction (e.g., the direction Y shown in FIG. 3), wherein the first trenches 110 and the second trenches 126 are separated by a portion of the epitaxial layer 104. The epitaxial layer 104 between the first trenches 110 and the second trenches 126 comprises first doping regions 120 and second doping regions 130. The first doping regions 120 and the second doping regions 130 have opposite conductivity types and the first doping region 120 and the second doping region 130 are neighboring each other to form an interface therebetween. Thus, super-junction structures 134 of an embodiment of the disclosure are formed. In some embodiments, an insulating liner layer 116/132 is formed on the sidewalls 121/131 and the bottom surfaces 114/133 of the first trenches 110/second trenches 126, and an insulating material 124/136 is filled into the first trenches 110/second trenches 126, as shown in FIG. 1F. In other embodiments, a doping material 402/404 is filled into the first trenches 110/second trenches 126, as shown in FIG. 4D.

A gate structure 142 comprising a gate pattern layer 140 and a gate dielectric pattern layer 138 is disposed on the epitaxial layer 104 and covers one end of each first trench 110, that of each second trench 126, and the insulating material or the doping material in the first trenches 110 and the second trenches 126. A channel 143 is under the gate structure 142 and extends along a second direction (e.g., the direction X shown in FIG. 3), wherein the first direction is substantially perpendicular to the second direction. A well region 144 is adjacent to a side of the gate structure 142. The well region 144 comprises a source region 146 and a connection region 150 therein, wherein the source region 146 is adjacent to a side of the gate structure 142. A third doping region 122 is adjacent to the same side of the first trenches 110 and the second trenches 126 which is away from the gate structure 142. The third doping region 122 comprises a drain region 148 therein.

In some embodiments, the substrate 102, the first doping region 120, the third doping region 122, the source region 146 and the drain region 148 have the first conductivity type. The second doping region 130, the well region 144 and the connection region 150 have the second conductivity type. For an n-type field effect metal oxide transistor, the first conductivity type is n-type and the second conductivity type is p-type. For a p-type field effect metal oxide transistor, the first conductivity type is p-type and the second conductivity type is n-type.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate;
   forming an epitaxial layer on the substrate;
   forming first trenches and second trenches in the epitaxial layer and being alternately arranged along a first direction;
   doping the epitaxial layer to form a first doping region and a second doping region in the epitaxial layer between the adjacent first and second trenches, wherein the first doping region and the second doping region have different conductivity types, and a super-junction structure is formed at an interface between the first doping region and the second doping region, and wherein an edge of the first doping region is coplanar with a sidewall of the first trench, and an edge of the second doping region is coplanar with a sidewall of the second trench; and
   forming a gate structure over the epitaxial layer, wherein the epitaxial layer under the gate structure comprises a channel extending along a second direction from a source region toward a drain region, the first direction is perpendicular to the second direction, and wherein the source region is in a well region in the epitaxial layer, the well region is under a portion of the gate structure and separated from the first doping region and the second doping region, the gate structure covers one end of each first trench and one end of each second trench, and the second direction is a lateral direction.

2. The method as claimed in claim 1, wherein the first trenches and the second trenches are formed by different lithography and etching steps.

3. The method as claimed in claim 1, wherein the step of forming the first doping region and the second doping region comprises doping the epitaxial layer through the sidewalls of the first trenches and the second trenches.

4. The method as claimed in claim 3, wherein the epitaxial layer is doped by ion implantation.

5. The method as claimed in claim 1, wherein the step of forming the first doping region and the second doping region comprises:
   filing the first trenches with a first doping material;
   filing the second trenches with a second doping material, wherein the first doping material and the second doping material have different conductivity types; and
   performing a thermal diffusion process.

6. The method as claimed in claim 5, wherein the first doping material and the second doping material comprise doped epitaxial material or doped polysilicon.

7. The method as claimed in claim 1, further comprising doping the epitaxial layer neighboring one end of each first trench and that of each second trench to form a third doping region.

8. The method as claimed in claim 1, further comprising filing the first trenches and the second trenches with an insulating material.

* * * * *